United States Patent [19]
Becker et al.

[11] Patent Number: 5,394,034
[45] Date of Patent: Feb. 28, 1995

[54] PROGRAMMABLE LOGIC ARRAY HAVING PROGRAMMABLE OUTPUT DRIVER DRIVE CAPACITY

[75] Inventors: Steffen Becker, Zorneding; Doris Schmitt-Landsiedel, Ottobrunn; Doris Keitel-Schulz, Munich, all of Germany

[73] Assignee: Siemens Aktiengesellschaft, Munich, Germany

[21] Appl. No.: 98,229

[22] Filed: Jul. 27, 1993

[30] Foreign Application Priority Data

Jul. 27, 1992 [DE] Germany .......................... 4224804

[51] Int. Cl.6 ................. H03K 19/092; H03K 19/173
[52] U.S. Cl. ........................................ 326/39; 326/82
[58] Field of Search ................................ 307/465, 475

[56] References Cited

U.S. PATENT DOCUMENTS

| | | | |
|---|---|---|---|
| 4,604,731 | 8/1986 | Konishi | 307/475 |
| 4,706,216 | 11/1987 | Carter | 365/94 |
| 4,758,746 | 7/1988 | Birkner et al. | 307/465 |
| 5,003,205 | 3/1991 | Kohda et al. | 307/465 |
| 5,034,634 | 7/1991 | Yamamoto | 307/475 |
| 5,153,450 | 10/1992 | Ruetz | 307/475 |
| 5,231,312 | 7/1993 | Gongwer et al. | 307/465 |
| 5,247,195 | 9/1993 | Turner et al. | 307/475 |

OTHER PUBLICATIONS

IEEE Journal, vol. 26, No. 3, Mar. 1991, pp. 277–282, Jonathan Rose, "Flexibility of Interconnection Structures for Field-Programmable Gate Arrays".
IEEE Journal, vol. 25, No. 5, Oct. 1990, pp. 1217–1225, Jonathan Rose, "Architecture of Field-Programmable Gate Arrays".
IEEE 1990, pp. 31.2.1–31.2.7, Hung-Cheng Hsieh et al., "Third Generation Archit. Boosts Speed and Density of Field-Progr. Gate Arrays".
Technology Update, EDN Sep. 1989, pp. 91–100 Doug Conner "PLD Architectures Require Scrutiny".
ERA60100 (Incl. ERA 60100p), Aug. 1990, pp. 1–23, Plessey Semiconductors, "Electrically Reconfigurable Array-ERA".

Primary Examiner—Edward P. Westin
Assistant Examiner—Richard Roseen
Attorney, Agent, or Firm—Herbert L. Lerner; Laurence A. Greenberg

[57] ABSTRACT

A programmable logic array includes configurable logic cells disposed in lines and columns. Each of the logic cells has signal inputs, control inputs, at least one signal output, and an output driver circuit connected upstream of the at least one signal output. The output driver circuit has a terminal for a first and a second supply potential and is connected to at least one of the control inputs. The output driver circuit is controllable for setting its driver capacity to a level other than zero, corresponding to a signal value, by a digital signal applied to the at least one control input. Conductor tracks and switching elements for interconnecting the conductor tracks connect the at least one signal output of each of the logic cells to at least one of the signal inputs of at least another one of the logic cells.

8 Claims, 4 Drawing Sheets

PROGRAMMABLE LOGIC ARRAY HAVING PROGRAMMABLE OUTPUT DRIVER DRIVE CAPACITY

BACKGROUND OF THE INVENTION

Field of the Invention

The invention relates to a programmable logic array having the characteristics:

(a) the array includes configurable logic cells, which are disposed in lines and columns;

(b) the array includes conductor tracks, which can be connected to one another through switching elements;

(c) each of the logic cells has signal inputs, control inputs, and at least one signal output;

(d) the signal output of each logic cell can be connected to at least one of the signal inputs of at least a further one of the logic cells through the switching elements and conductor tracks; and (e) the signal output of each logic cell is preceded by an output driver circuit, which is connected to one of the control inputs.

A programmable logic array is known, for instance from an article entitled "Architecture of Field-Programmable Gate Arrays: The Effects of Logic Block Functionality on Area Efficiency" by J. Rose et al, in IEEE Journal of Solid-State Circuits, Vol. 25, No. 5, Oct. 1990. Such an array contains a plurality of logic cells, which are disposed regularly, for instance in lines and columns. The logic cells have a plurality of input signal terminals, at least one output signal terminal, and terminals for control signals. By way of example, they include a memory element and circuit means with which a combinatorial logic function can be achieved. The circuit means and the memory elements can be connected to one another through a number of possible predetermined signal paths. One output of the memory element may be fed back to its input, either directly or through the circuit means. The output of the logic cell can be connected to the output of the memory element or to one output of the circuit means. The input of the memory element can also be connected directly to an input signal terminal. In the connection paths mentioned, multiplexing devices are incorporated, with which one of the possible signal paths is selected. In order to configure the logic cell, control signals through which the multiplexing devices are controlled are applied to the control inputs.

Connecting lines and circuit elements for electrically connecting the connecting lines are also present. The circuit elements are controllable in such a way that two intersecting connecting lines can be electrically connected with one another by them. In that way, the output of one logic cell is connected to an input of a further logic cell. Through the use of the configuration of a logic cell by means of the control signals and through the connection of logic cells with one another, a switch mechanism, that is a logical linkage, in which states are stored in memory, is achieved.

The signal delay time along the connecting lines between interconnected logic cells is known to rise with increasing line length. Therefore, long connections reduce the processing speed of the switch mechanism made with the configuration. Any statement about the signal transit time is accordingly possible only after the logic gate functions that realize the switching mechanism have been placed in various cells and they have been connected.

SUMMARY OF THE INVENTION

It is accordingly an object of the invention to provide a logic cell for a programmable logic array, which overcomes the hereinafore-mentioned disadvantages of the heretofore-known devices of this general type and which does so in such a way that the processing speed of the array is increased.

With the foregoing and other objects in view there is provided, in accordance with the invention, a programmable logic array comprising configurable logic cells disposed in lines and columns, each of the logic cells having signal inputs, control inputs, at least one signal output, and an output driver circuit connected upstream of the at least one signal output, the output driver circuit having a terminal for a first and a second supply potential and being connected to at least one of the control inputs, and the output driver circuit being controllable for setting its driver capacity to a level other than zero, corresponding to a signal value, by means of a digital signal applied to the at least one control input; and conductor tracks and switching elements for interconnecting the conductor tracks, the switching elements and the conductor tracks connecting the at least one signal output of each of the logic cells to at least one of the signal inputs of at least another one of the logic cells.

Therefore, the object of the invention is attained by controlling the driver capacity of the output driver circuit.

In accordance with another feature of the invention, the output driver circuit includes a control logic having one input and at least two outputs, and at least two amplifier stages to be shut off, each of the amplifier stages has one control input and one terminal for the first and second supply potential; the input of the control logic is connected to the at least one control input of the logic cell, and the outputs of the control logic are each connected to a respective one of the control inputs of the amplifier stages; the amplifier stages have input/output signal paths being connected in parallel; and the control logic generates signals at its outputs, with which at least one of the amplifier stages is turned on and the other of the amplifier stages is turned off.

In accordance with a further feature of the invention, the amplifier stages have different driver capacities.

In accordance with an added feature of the invention, the at least two amplifier stages are n amplifier stages, and the control logic is a one-out-of-n decoder.

In accordance with an additional feature of the invention, the amplifier stages are tri-state stages.

In accordance with yet another feature of the invention, the output driver circuit has a terminal for an enable signal, and logic switching elements connected between the terminal for the enable signal and each of the control inputs of the amplifier stages, for jointly turning the amplifier stages off with the enable signal.

In accordance with a concomitant feature of the invention, there is provided a further amplifier stage being connected parallel to the signal paths of the amplifier stages and having a control input being connected directly to the terminal for the enable signal.

Other features which are considered as characteristic for the invention are set forth in the appended claims.

Although the invention is illustrated and described herein as embodied in a programmable logic array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
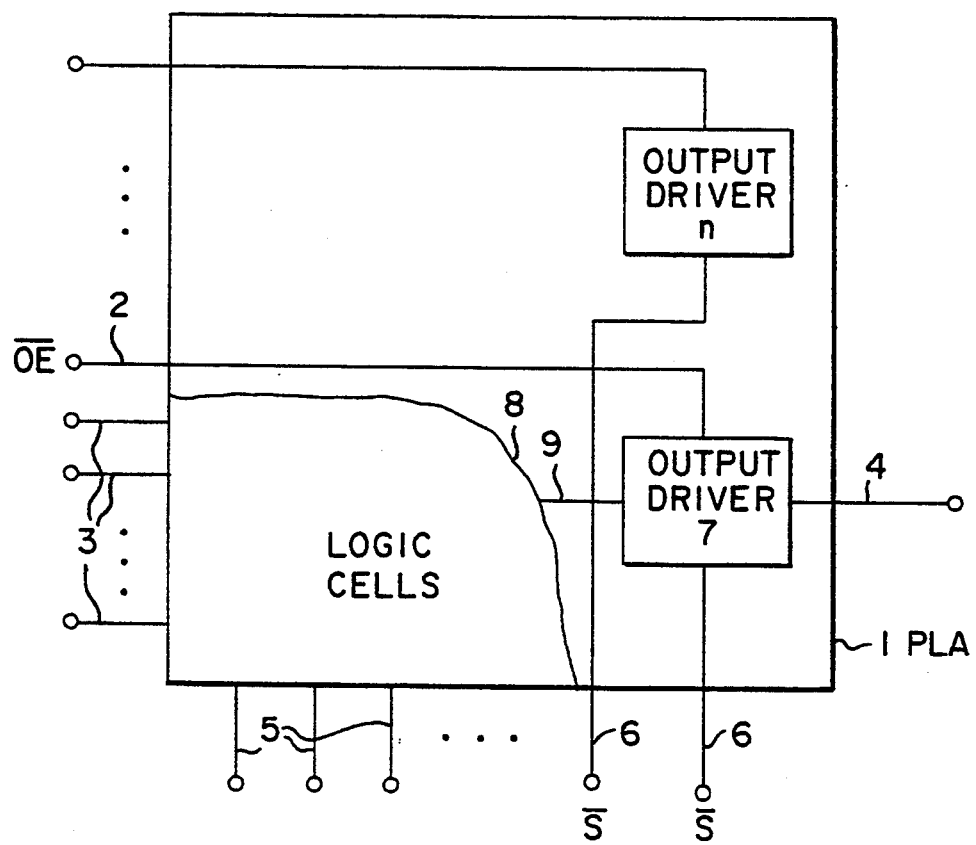
FIG. 1 is a block circuit diagram of a logic cell according to the invention.

Referring now in detail to the figures of the drawing, in which the same reference numerals are used, and first, particularly, to FIG. 1 thereof, there is seen a logic cell 1 which has an output driver circuit 7 and a remainder 8. A number of input signal terminals 2, 3 are assigned to the output driver circuit 7 and the remainder 8. One input signal terminal 2 thereof is connected to the output driver circuit 7. The other input signal terminals 3 are connected to the remainder 8 of the logic cell. The remainder 8 has an output 9 which is connected to the output driver stage 7. An output 4 of the output driver stage 7 serves as an output of the logic cell 1. The output driver circuit 7 is connected to one control input 6 of the logic cell. Other control inputs 5 are connected to the remainder 8 of the logic cell. The signals present at the control inputs 5, 6 serve to configure the logic cell 1.

As an example which is not shown in the drawing, the remainder 8 of the logic cell may include a configuration for generating a combinatorial logical function, such as a look-up table, and a memory element. A number of connections of the elements to one another are present. Through the use of multiplexers, certain signals paths are defined. Through the use of a signal $\overline{S}$ applied to the control input 6, the driver capacity of the output driver stage 7 is set as high or low. In order to reverse the charge of a capacitive load that is connected to the output 4 and is located in the output driver stage 7, various current intensities can be set in this way. The capacitive load is equivalent to the line capacitance of a line connected to the output 4, by means of which line the logic cell 1 is connected to at least one further logic cell. This load increases with increasing line length and with an increasing number of connected logic cells. At the transition of the logic level at the output 4 from a logical H level to an L level, a current is drawn by the output driver stage 7. If not, a current is furnished by it. Accordingly, an advantage of the logic cell is that its output driver capacity can be adapted to the load connected to its output.

Figure 2:
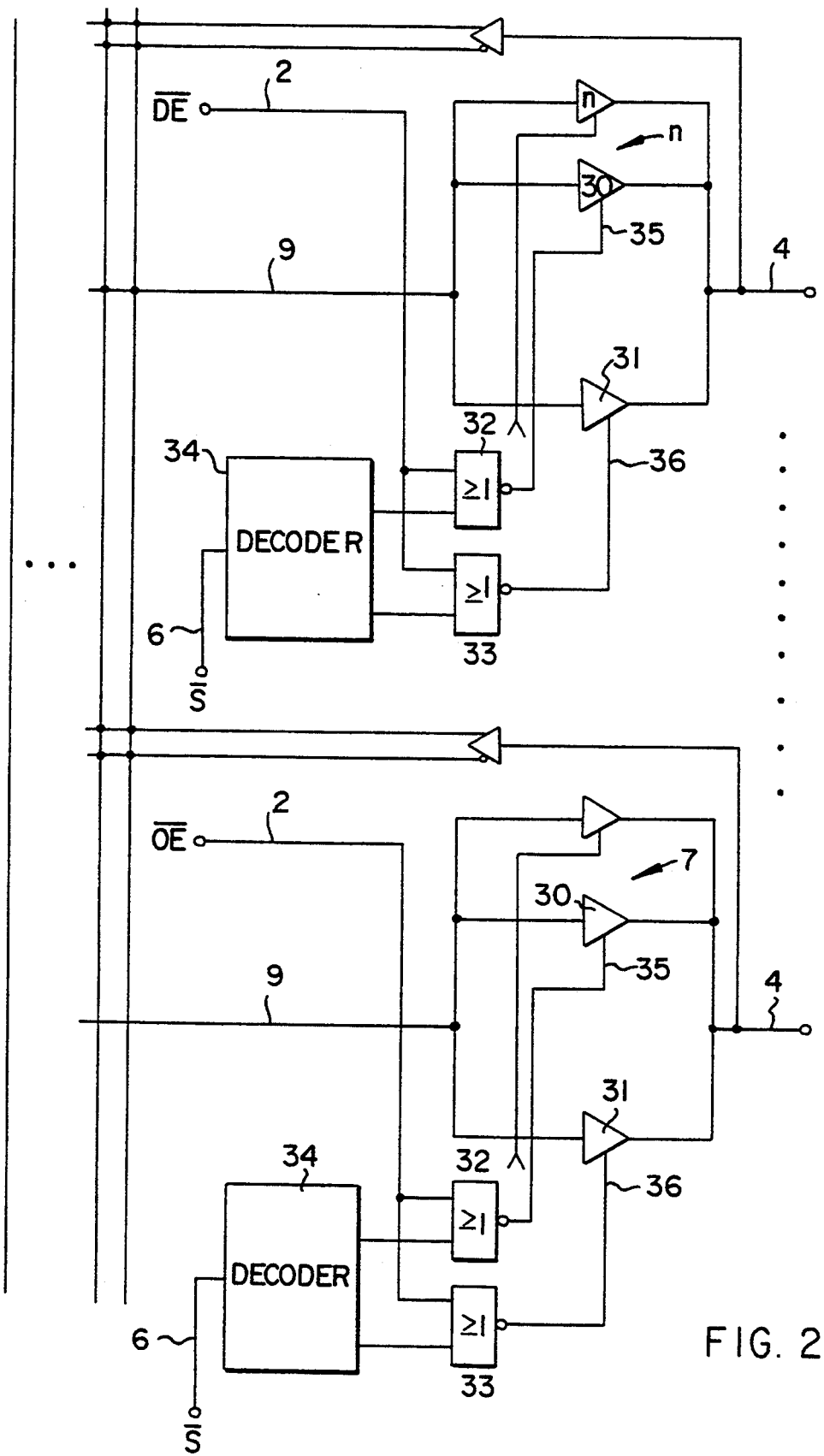
FIG. 2 is a schematic and block diagram of a first embodiment of an output driver circuit contained in the logic cell.

An embodiment of the output driver circuit or stage 7 is shown in FIG. 2. Between the input 9 and the output 4 thereof, the output driver circuit or stage 7 includes two parallel-connected data paths with switchable amplifiers 30, 31. These amplifiers can be turned on and off by signals applied to their control inputs 35, 36. The control inputs 35, 36 of the amplifier stages 30, 31 are connected to outputs of NOT-OR switch elements 32, 33. An enable signal $\overline{OE}$ at the control input 2 of the logic cell and an output of a control logic 34 are delivered to each of the NOT-OR elements. The signal $\overline{S}$ applied to the control input 6 is fed into the control logic 34.

The output driver circuit is activated by the enable signal $\overline{OE}$. If the level of the signal $\overline{OE}$ is L, then the negated output signal of the control logic 34 in each case appears at the output of each NOT-OR element 32 and 33. If the level for the enable signal $\overline{OE}$ is H, the result at the outputs of the elements 32, 33 is always an L level. An L level at the control inputs 35, 36 turns off the amplifier stages 30, 31. The control logic 34 performs a function in such a way that that at least one of its output signals is L in accordance with its input signal $\overline{S}$. As a result, and on the condition that the enable signal $\overline{OE}$ is L, at least one of the amplifier stages 30, 31 is turned on.

On one hand, it is possible to construct the amplifier stages 30, 31 identically, so that both amplifier stages produce the same driver capacity. On the other hand, the amplifier stages 30, 31 may also be dimensioned differently, so that they have different driver capacities. In the first instance, the switchable driver capacity of the output driver stage 7 is attained by connecting the amplifier stages 30, 31 in parallel. In the second instance, the differing driver capacity is achieved both by switching back and forth between the amplifier stages 30, 31 and by parallel connection. These different driver capacities are set by the control logic 34.

Figure 3:
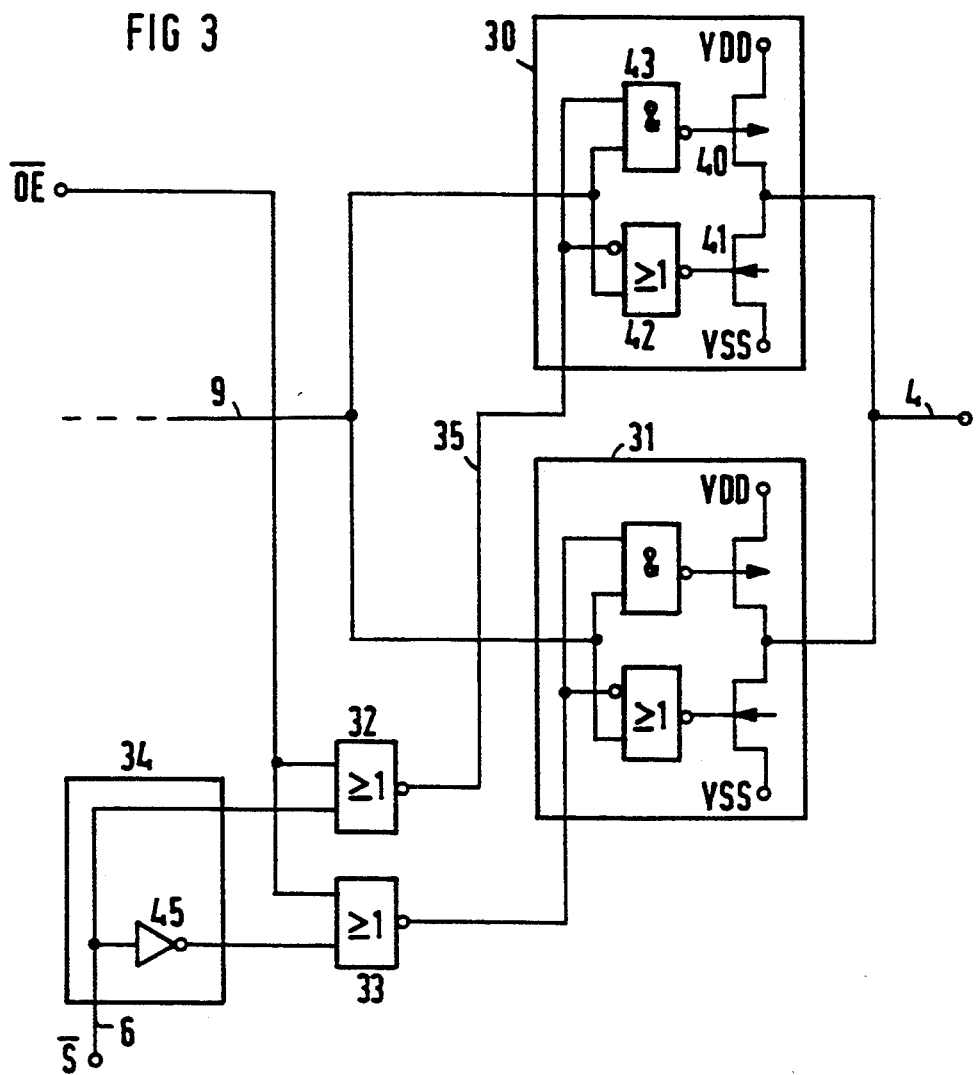
FIG. 3 is a schematic and block diagram of a second embodiment of the output driver circuit.

FIG. 3 shows a further embodiment of the output driver circuit 7. The amplifier stages 30, 31 that are capable of being switched off are constructed in this case as tri-state stages, both of which have a different driver capacity. This can be done by means of dimensioning the output transistors differently. The control logic 34 is constructed in such a way that only one of the amplifier stages 30, 31 is turned on at a given time. The other amplifier stage is off at that time.

The basic structure of the tri-state stages 30, 31 will be described by taking the tri-state stage 30 as an example. Two MOS transistors of different polarity, which are connected in series at their drain-to-source paths, are disposed between two supply potentials VDD, VSS. The transistors include a p-channel MOS transistor 40 that is connected to the positive supply potential VDD, and an n-channel MOS transistor 41 that is connected to the negative supply potential VSS. The gate terminals of the transistors are respectively connected to the output of a NOT-AND element 43 and a NOT-OR element 42. One input of the elements 42, 43 is the signal input 9 of the output driver stage. Another input is the control input 35 of the tri-state stage. The switching element 43 is connected directly to this control input 35, and the switching element 42 is connected to it in negated fashion. .The effect of this triggering of the MOS transistors 40, 41 is that the amplifier stage 30 can assume one of three states: either only the MOS transistor 40, or only the MOS transistor 41 is conducting, or both MOS transistors 40, 41 are blocked. Thus the result is either an H or an L level, or a high-impedance state.

The control logic 34 is constructed in such a way that only one of its outputs has an L level. As a result, only one of the amplifier stages 30, 31 is activated. Therefore the control logic 34 functions as a one-out-of-two decoder. To that end, one of its outputs is connected directly to the control input 6, and the other of its outputs is connected to the control input 6 through an inverter 45.

Figure 4:
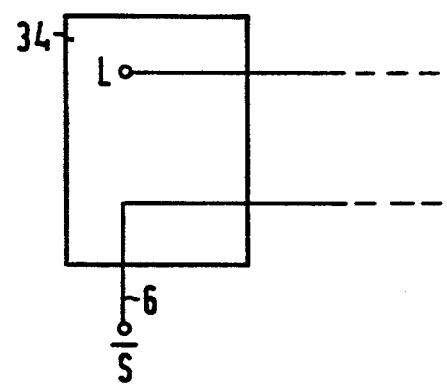
FIG. 4 is a block diagram of an embodiment of a control logic contained in the output driver circuit.
Figure 5:
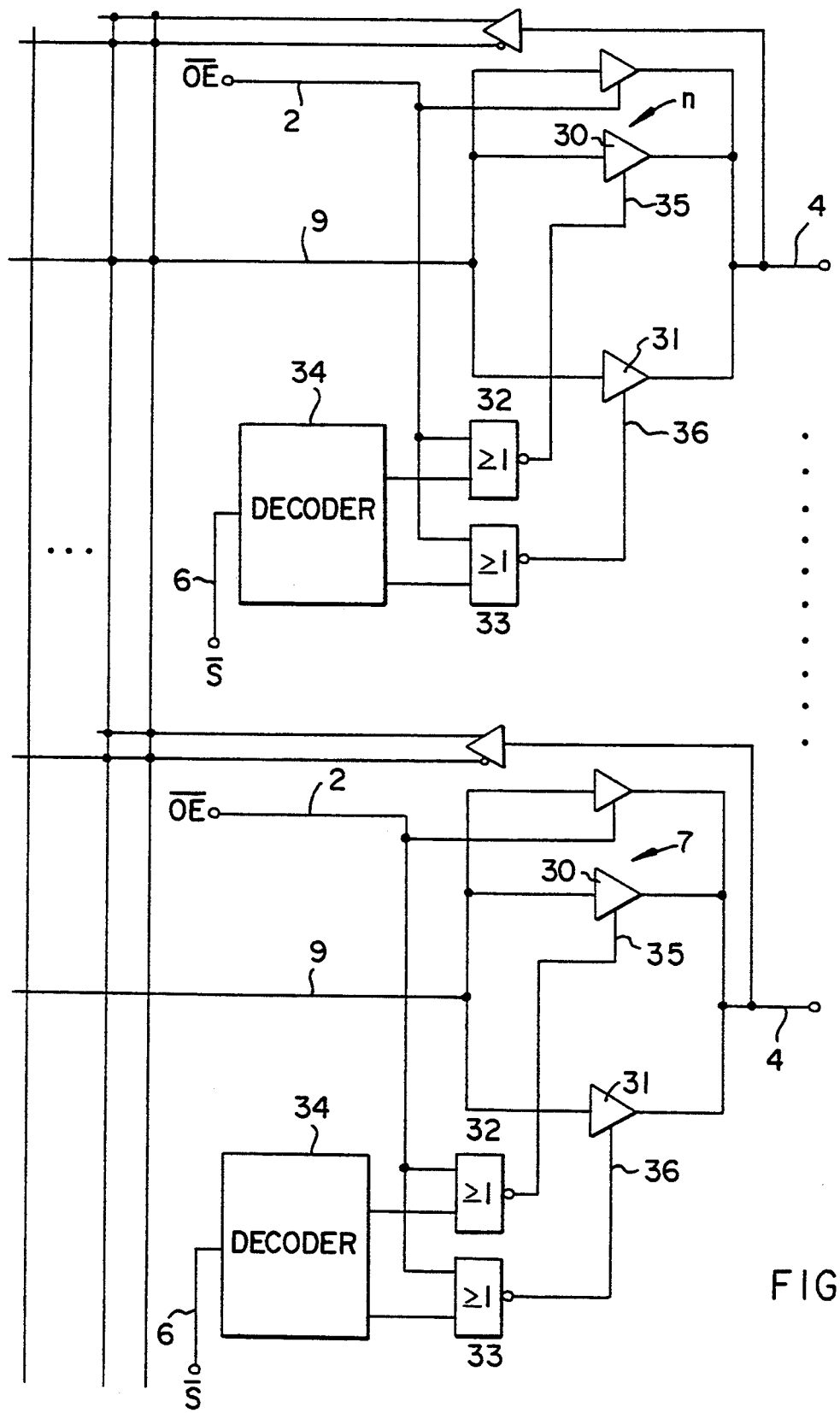
FIG. 5 is a schematic and block diagram of a third embodiment of the output driver circuit contained in the logic cell.

A further embodiment of the control logic 34 is shown in FIG. 4. This embodiment is employed if the tri-state stages 30, 31 of FIG. 3 have the same driver capacity or in other words are dimensioned identically. In the case of the low driver capacity, only one of its outputs has an L level, while in the case of the high driver capacity both outputs have an L level. To that end, one of its outputs is applied internally permanently to an L level, while the other of the outputs is connected to the control input 6.

In each of the exemplary embodiments of FIGS. 2–4 discussed above, there are only two amplifier stages 30, 31 which are connected in parallel at their signal paths. More than two amplifier stages may in general be connected in parallel. If amplifier stages have different driver capacities, for instance, then a one-out-of-n decoder is used as the control logic. If the amplifier stages each have the same driver capacity, then a control logic is used in which a different number of L levels is present at their output terminals for every settable driver capacity. Advantageously, a digital many-out-of-n decoder is used for this purpose. One specific driver capacity of the output driver circuit is assigned to each of the bit combinations present at the inputs of the control logic.

It is also conceivable for a further amplifier stage to be connected in parallel in terms of its signal path to the amplifier stages 30, 31, with its control input being connected directly to the signal input 2. This amplifier stage is then switchable directly by means of the enable signal $\overline{OE}$.

We claim:

1. A programmable logic array comprising:
    configurable logic cells disposed in lines and columns, each of said logic cells having signal inputs, control inputs, at least one signal output, and an output driver circuit connected upstream of the at least one signal output,
    said output driver circuit having a terminal for a first and a second supply potential and being connected to at least one of the control inputs, and
    said output driver circuit being controllable for setting its driver capacity to a level other than zero, corresponding to a signal value, by means of a digital signal applied to the at least one control input; and
    conductor tracks and switching elements for interconnecting said conductor tracks, said switching elements and said conductor tracks connecting the at least one signal output of each of said logic cells to at least one of the signal inputs of at least another one of said logic cells.

2. The programmable logic array according to claim 1, wherein:
    (a) said output driver circuit includes a control logic having one input and at least two outputs, and at least two amplifier stages to be shut off, each of said amplifier stages has one control input and one terminal for the first and second supply potential;
    (b) the input of said control logic is connected to the at least one control input of said logic cell, and the outputs of said control logic are each connected to a respective one of the control inputs of said amplifier stages;
    (c) said amplifier stages have input/output signal paths being connected in parallel; and
    (d) said control logic generates signals at its outputs, with which at least one of said amplifier stages is turned on and the other of said amplifier stages is turned off.

3. The programmable logic array according to claim 2, wherein said amplifier stages have different driver capacities.

4. The programmable logic array according to claim 3, wherein said at least two amplifier stages are n amplifier stages, and said control logic is a one-out-of-n decoder.

5. The programmable logic array according to claim 2, wherein said amplifier stages are tri-state stages.

6. The programmable logic array according to claim 2, wherein said output driver circuit has a terminal for an enable signal, and logic switching elements connected between said terminal for the enable signal and each of the control inputs of said amplifier stages, for jointly turning said amplifier stages off with the enable signal.

7. The programmable logic array according to claim 6, including a further amplifier stage being connected parallel to the signal paths of said amplifier stages and having a control input being connected directly to said terminal for the enable signal.

8. In a programmable logic array having configurable logic cells disposed in lines and columns, each of said logic cells comprising:
    signal inputs, control inputs, at least one signal output, and an output driver circuit connected upstream of the at least one signal output,
    said output driver circuit having a terminal for a first and a second supply potential and being connected to at least one of the control inputs, and
    said output driver circuit being controllable for setting its driver capacity to a level other than zero, corresponding to a signal value, by means of a digital signal applied to the at least one control input.

* * * * *